(12) United States Patent
Hashizume et al.

(10) Patent No.: US 8,729,512 B2
(45) Date of Patent: May 20, 2014

(54) OPTICAL COUPLING ELEMENT AND METHOD FOR MANUFACTURING THE SAME

(75) Inventors: Shoji Hashizume, Kanagawa (JP); Masami Ebihara, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 267 days.

(21) Appl. No.: 13/370,391

(22) Filed: Feb. 10, 2012

(65) Prior Publication Data

US 2012/0223259 A1 Sep. 6, 2012

(30) Foreign Application Priority Data

Mar. 4, 2011 (JP) ................... 2011-048142

(51) Int. Cl.
*G02B 27/00* (2006.01)
(52) U.S. Cl.
USPC ........................................................ 250/551
(58) Field of Classification Search
USPC ........ 250/551, 239; 257/80–84, 98, E33.076, 257/E33.059, E33.06
See application file for complete search history.

(56) References Cited

U.S. PATENT DOCUMENTS 4,095,116 A * 6/1978 Felkel et al. .................. 250/551

FOREIGN PATENT DOCUMENTS

| JP | 7-142762 | 6/1995 |
|---|---|---|
| JP | 11-233810 | 8/1999 |
| JP | 2000-357816 | 12/2000 |
| JP | 2003-246840 | 9/2003 |
| JP | 2008-208179 | 9/2008 |

OTHER PUBLICATIONS

Japanese Office Action dated Mar. 11, 2014 in corresponding Japanese Patent Application No. 2011-048142 with English translation of Japanese Office Action.

* cited by examiner

*Primary Examiner* — Thanh Luu
*Assistant Examiner* — Renee Naphas
(74) *Attorney, Agent, or Firm* — Young & Thompson

(57) ABSTRACT

An optical coupling element includes a light emitting element and a light receiving element which receives emitted light from the light emitting element. The optical coupling element contains a silicone resin and includes a light transparent resin which covers the light emitting element and the light receiving element and transmits the signal light emitted from the light emitting element to the light receiving element (for example, a specific light transparent gel resin) and a light reflection resin which covers a circumference of the light transparent resin. To the light transparent resin, a dye which absorbs light having a shorter wavelength than a predetermined wavelength range including a light emitting wavelength of the light emitting element is added in a concentration of 0.7% by weight or less.

19 Claims, 7 Drawing Sheets

FIG. 8

| CLASSIFICATION | DYE CONCENTRATION (IN LIGHT TRANSPARENT RESIN) (Wt%) | DYE CONCENTRATION (IN LIGHT REFLECTION RESIN) (Wt%) | TRANSMISSION EFFICIENCY OF SIGNAL LIGHT (%) | TRANSMITTANCE OF INCOMING LIGHT (%) |
|---|---|---|---|---|
| EXAMPLE 1 | 0.3 | NONE | 99 | 99 |
|  | 0.5 | NONE | 95 | 98 |
|  | 1.0 | NONE | 45 | 50 |
| EXAMPLE 2 | 0.5 | 0.5 | 93 | 39 |
|  | 1.0 | 1.0 | 43 | 3 |
|  | 0.5 | 1.0 | 90 | 5 |
| COMPARATIVE EXAMPLE 1 | NONE | NONE | 100 (STANDARD) | 100 (STANDARD) |
| COMPARATIVE EXAMPLE 2 | 0.2 | 0.2 | 23 | 1 |
|  | NONE | NONE | 1 | 5 |
| COMPARATIVE EXAMPLE 3 | NONE | 0.3 | 99 | 80 |
|  | NONE | 0.5 | 98 | 40 |
|  | NONE | 1.0 | 95 | 5 |

OPTICAL COUPLING ELEMENT AND METHOD FOR MANUFACTURING THE SAME

CROSS-REFERENCE TO RELATED APPLICATIONS

The disclosure of Japanese Patent Application No. 2011-48142 filed on Mar. 4, 2011 including the specification, drawings and abstract is incorporated herein by reference in its entirety.

BACKGROUND

The present invention relates to an optical coupling element and a method for manufacturing the same.

An optical coupling element is configured by, for example, covering a light emitting element and a light receiving element with a light transparent resin and further covering the light transparent resin with a light reflection resin (For example, Patent Document 1).

In this type of optical coupling element, a light receiving element having a high S/N ratio may be configured by adding fine powder such as titanium oxide ($TiO_2$) as a reflective material to an outer covering light reflection resin. In other words, by the light reflection resin to which the reflective material is added, not only can light emitted from the light emitting element be effectively trapped in the light transparent resin, but also incoming light coming from a fluorescent lamp or the sun can be reflected and arrival of incoming light to the light receiving element can be suppressed.

Patent Document 2 describes that an S/N ratio of the light receiving element is improved by adding a dye having a certain light shielding property to the outer covering light reflection resin.

Patent Document 3 describes that fillers configured by titanium oxide and carbon are added to the outer covering light reflection resin.

PATENT DOCUMENTS

Patent Document 1: Japanese Unexamined Patent Application Publication No. Hei11 (1999)-233810
Patent Document 2: Japanese Unexamined Patent Application Publication No. 2000-357816
Patent Document 3: Japanese Unexamined Patent Application Publication No. Hei7 (1995)-142762

SUMMARY

Meanwhile, a thickness of the outer covering light reflection resin tends to be reduced because a smaller and thinner optical coupling element is required. In the future, probably there is a possibility that sufficient improvement of the S/N ratio becomes difficult only by configuration in which the dye is added to the light reflection resin. In this circumstance, improvement of shielding property for incoming light by adding the dye to an inner light transparent resin may probably be preferable for improving the S/N ratio of the light receiving element by using the dye.

However, when the inventors of the present invention have investigated mixing of the dye to the light transparent resin containing a silicone resin, the inventors have found that transmission efficiency of signal light is decreased by crystallization of the dye within the light transparent resin when the dye is mixed in the light transparent resin.

As described above, it has been difficult to improve the shielding property for the incoming light by adding the dye to the light transparent resin without decreasing the transmission efficiency of the signal light in the inner light transparent resin of the optical coupling element.

According to one aspect of the present invention, there is provided an optical coupling element including: a light emitting element; a light receiving element which receives emitted light from the light emitting element; a light transparent resin which contains a silicone resin, covers the light emitting element and the light receiving element, and transmits signal light emitted from the light emitting element to the light receiving element; and a light reflection resin which covers a circumference of the light transparent resin, in which a dye which absorbs light having a shorter wavelength than a predetermined wavelength range including a light emitting wavelength of the light emitting element is added in a concentration of 0.7% by weight or less to the light transparent resin.

According to the optical coupling element, the dye absorbing light having a shorter wavelength than the predetermined wavelength range including the light emitting wavelength of the light emitting element is added in a concentration of 0.7% by weight or less to the light transparent resin. Thereby, the shielding property for the incoming light caused by the light transparent resin is improved without decreasing the transmission efficiency of the signal light in the inner light transparent resin.

According to another aspect of the present invention, there is provided a method for manufacturing an optical coupling element, the method including the steps of: adding a dye which absorbs light having shorter wavelength than a predetermined wavelength range including a light emitting wavelength of a light emitting element in a concentration of 0.7% by weight or less to a light transparent resin containing a silicone resin; covering the light emitting element and a light receiving element which receives emitted light from the light emitting element with a light transparent resin; and covering a circumference of the light transparent resin with a light reflection resin.

According to still another aspect of the present invention, there is provided a method for manufacturing an optical coupling element, the method including the steps of: preparing a light transparent resin containing a silicone resin; determining an added amount of a dye so that the dye is not crystallized in the light transparent resin, when the dye absorbing light having shorter wavelength than a predetermined wavelength range including a light emitting wavelength of the light emitting element is added to the light transparent resin; adding the dye to the light transparent resin within the range of determined concentration; covering the light emitting element and a light receiving element which receives emitted light from the light emitting element with the light transparent resin; and covering a circumference of the light transparent resin with a light reflection resin.

According to the aspects of the present invention, the shielding property for the incoming light can be improved by adding the dye to the light transparent resin without decreasing the transmission efficiency of the signal light in the inner light transparent resin of the optical coupling element.

BRIEF DESCRIPTION OF THE DRAWINGS

FIG. 8 is a table showing properties of optical coupling elements in examples of this embodiment and comparative examples.

DETAILED DESCRIPTION

Figure 1:
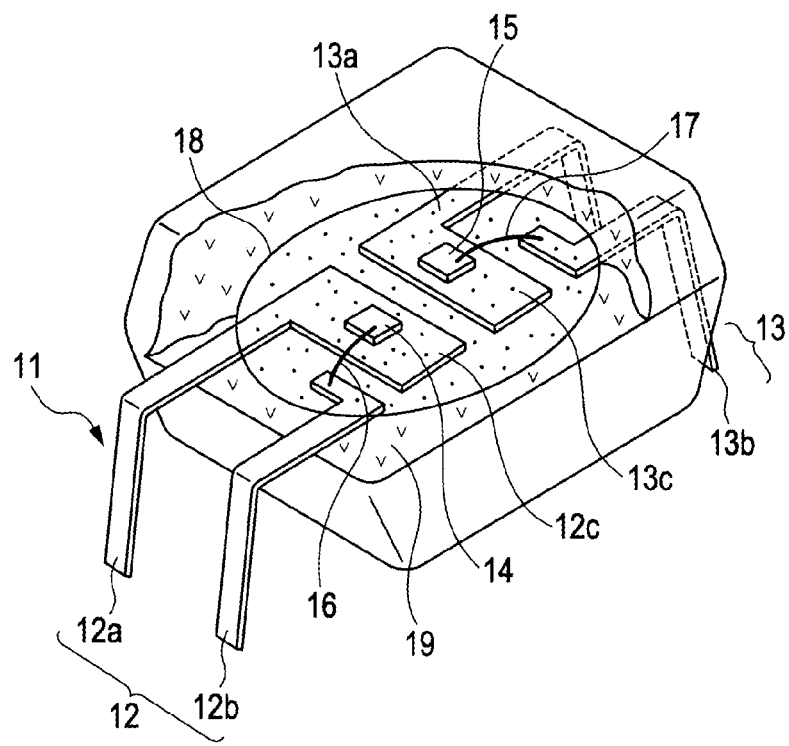
FIG. 1 is a perspective view of an optical coupling element according to an embodiment of the present invention and shows an inner structure of the optical coupling element by cutting out a part.

Hereinafter, embodiments of the present invention are described using the drawings. In all drawings, the same reference numeral is assigned to a similar configuration element and description thereof is arbitrarily omitted.

Figure 2:
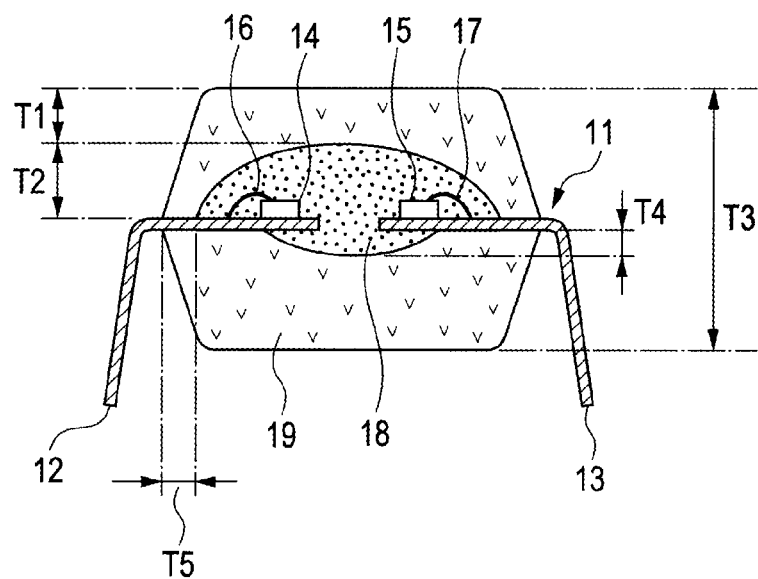
FIG. 2 is a cross-sectional view of the optical coupling element according to this embodiment.

FIG. 1 is a perspective view of an optical coupling element according to an embodiment and shows an inner structure of the optical coupling element by cutting out a part. FIG. 2 is a cross-sectional view of the optical coupling element according to the embodiment.

An optical coupling element according to the embodiment includes a light emitting element 14; a light receiving element 15 which receives emitted light from the light emitting element 14; a light transparent resin which contains a silicone resin, covers the light emitting element 14 and the light receiving element 15, and transmits signal light emitted from the light emitting element 14 to the light receiving element 15 (for example a specific light transparent gel resin 18); and a light reflection resin 19 which covers a circumference of the light transparent resin, in which a dye which absorbs light having a shorter wavelength than a predetermined wavelength range including a light emitting wavelength of the light emitting element 14 is added in a concentration of 0.7% by weight or less to the light transparent resin. Hereinafter, the optical coupling element is described in detail.

In this optical coupling element, for example, two pairs of externally derived leads 12 (12a and 12b) and 13 (13a and 13b) formed in a lead frame are located in a state of facing in an opposite direction each other over a plain surface. In each pair, tabs 12c and 13c are integratedly formed with each one of the externally derived leads 12a and 13a, respectively. In each of tabs 12c and 13c, a light emitting element 14 and a light receiving element 15 are mounted respectively. Electrode pads of the light emitting element 14 and the light receiving element 15 are electrically coupled to the other externally derived leads 12b and 13b of each pair though bonding wires 16 and 17.

The light emitting element 14 and the light receiving element 15 are collectively covered with a specific light transparent gel resin 18 containing a silicone resin and a light absorbent (a dye) by a potting method or the like. In addition, the outer surface thereof is sealed with a light reflection resin 19 by a transfer molding method or the like.

The specific light transparent gel resin 18 is obtained by adding (formulating) the light absorbent (the dye) to the gel resin of a silicone resin. In this specific light transparent gel resin 18, each shape of the upper surface and the lower surface thereof is almost spherical. Preferably, these surfaces are configured as an ellipsoid of revolution in which an emitting surface of the light emitting element 14 and a receiving surface of the light receiving element 15 are a first focal point and a second focal point, respectively. An outer shape of the light reflection resin 19 is configured as a package shape required for the optical coupling element.

In the optical coupling element having such a configuration, an element which has a center wavelength of emitted light of the light emitting element of 850 nm or more and 950 nm or less in an infrared wavelength region is generally used. When the light emitting element 14 having such an infrared wavelength region is used, fine powder of inorganic oxides having high relative permittivity such as titanium oxide ($TiO_2$) is added to the light reflection resin 19 as a reflective material.

As the light absorbent of the specific light transparent gel resin 18, for example, a visible light rejection dye (a dye absorbing visible light) having spectroscopic properties in which a rising wavelength is 690 nm and light transmittance in 850 nm or more and 950 nm or less is 80% or more is formulated (added) to the specific light transparent gel resin in a range of concentration not exceeding a solubility in the specific light transparent gel resin.

Here, the light absorbent is more particularly described.

The light absorbent is a dye absorbing light having a shorter wavelength than the predetermined wavelength range including a light emitting wavelength of the light emitting element 14. Such a light absorbent is added to the specific light transparent gel resin 18 in a concentration of, for example, 0.3% by weight or more and 0.7% by weight or less.

When a concentration of the light absorbent in the specific light transparent gel resin 18 exceeds 0.7% by weight (for example, the concentration is about 1.0% by weight), light transmission efficiency in which signal light emitted from the light emitting element 14 is transmitted in the specific light transparent gel resin 18 rapidly deteriorates. This is caused by the following reason. When a glass-transition temperature of the gel resin is, for example, −40° C. or less, the gel resin has molecular motion under a temperature environment of −40° C. or more which is a common operation temperature range of a semiconductor device. As a result, the formulated light absorbent also repeats abnormal vibration in accordance with the molecular motion of the gel resin. The excessively formulated light absorbent forms large particles due to recrystallization in the gel resin caused by the abnormal vibration. This light absorbent forming large particles increases light transparency of visible light in the gel resin and a shielding property for the external light coming from a fluorescent lamp or the sun is decreased. In addition, the light transmission efficiency deteriorates because the light absorbent which forms large particles absorbs infrared light emitted from the light emitting element 14. More specifically, although the light absorbent is uniformly dispersed just after adding the light absorbent to the gel resin, the light absorbent is crystallized with time and absorbs light having a light emitting wavelength of the light emitting element 14. By setting a concentration of the light absorbent in the gel resin to 0.7% by weight or less, the recrystallization of the light absorbent in the gel resin is suppressed and uniform dispersion of the light absorbent is easy to be maintained. The concentration of the light absorbent in the specific light transparent gel resin 18 is preferably 0.6% by weight or less and more preferably 0.5% by weight or less.

Color tone of the specific light transparent gel resin 18 can turn to black by adding 0.3% by weight or more of the light absorbent to the specific light transparent gel resin 18.

Figure 3:
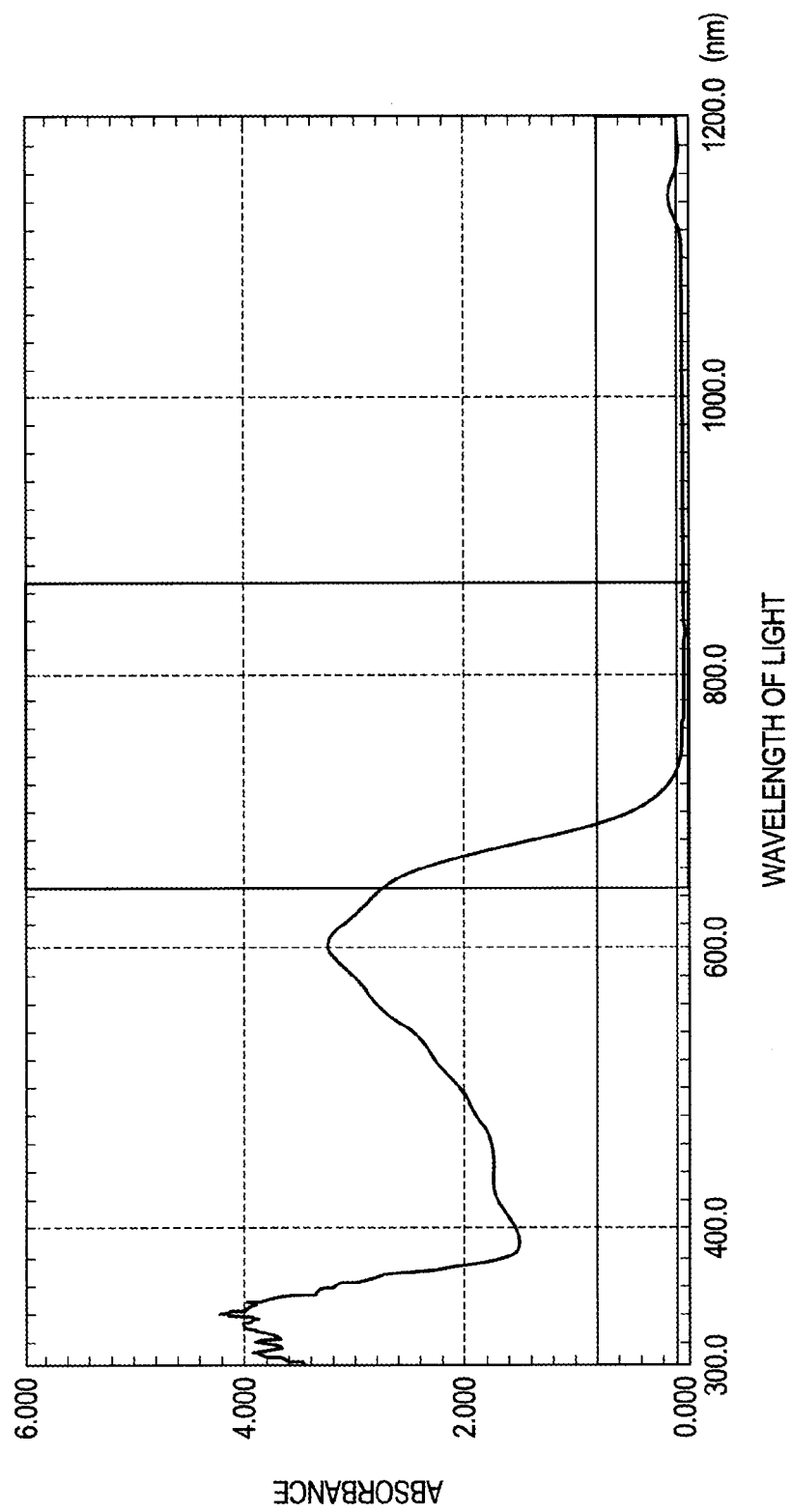
FIG. 3 is a graph showing an absorbance spectrum of a light transparent resin to which a dye is added.
Figure 4:
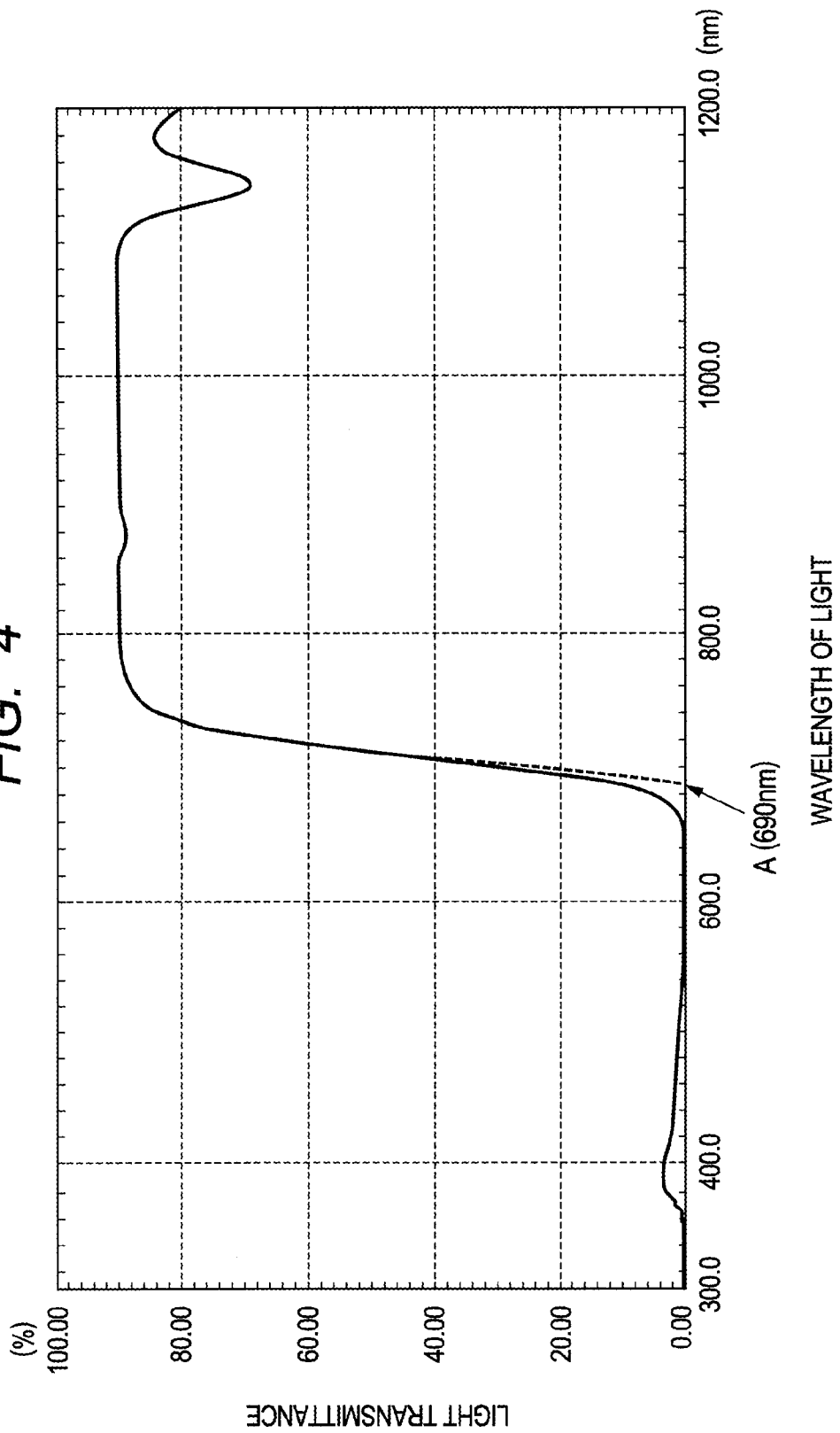
FIG. 4 is a graph showing a transmittance spectrum of the light transparent resin to which the dye is added.

FIG. 3 and FIG. 4 are graphs showing one example of properties of the light absorbent (the visible light rejection dye). Among them, FIG. 3 is a graph showing an absorbance spectrum of the specific light transparent gel resin 18 to which the light absorbent is added, and FIG. 4 is a graph showing a transmittance spectrum of the specific light transparent gel resin 18 to which the light absorbent is added. Horizontal axes in FIG. 3 and FIG. 4 represent a wavelength of light. A vertical axis of FIG. 3 represents absorbance. A vertical axis of FIG. 4 represents light transmittance (%). As exemplified in FIG. 3, the light absorbent is preferably a light absorbent which remarkably absorbs light having a wavelength range of 740 nm or less. As exemplified in FIG. 4, the light absorbent is preferably a light absorbent which remarkably transmits light having a wavelength range of 850 nm or more. As exemplified in FIG. 4, the rising wavelength is, for example, 690 nm. The rising wavelength means a wavelength at a shorter side wavelength of light which starts to transmit.

The light absorbent includes, for example, a blue-colored first dye, a yellow-colored second dye and a red-colored third dye.

A concentration of the first dye in the specific light transparent gel resin 18 is preferably 0.2% by weight or less. A concentration of the second dye in the specific light transparent gel resin 18 is preferably 0.1% by weight or less. A concentration of the third dye in the specific light transparent gel resin 18 is preferably 0.08% by weight or less.

A concentration of the first dye in the light absorbent is preferably 45% by weight or more and 65% by weight or less. A concentration of the second dye in the light absorbent is preferably 20% by weight or more and 30% by weight or less. A concentration of the third dye in the light absorbent is preferably 15% by weight or more and 25% by weight or less. A total concentration from the first dye to third dye in the light absorbent is 100% by weight or less, and preferably 100% by weight.

Among them, an absorbance peak wavelength of the first dye is preferably, for example, 550 nm or more and 680 nm or less. An absorbance peak wavelength of the second dye is preferably, for example, 350 nm or more and 450 nm or less. An absorbance peak wavelength of the first dye is preferably, for example, 450 nm or more and 550 nm or less.

Figure 5:
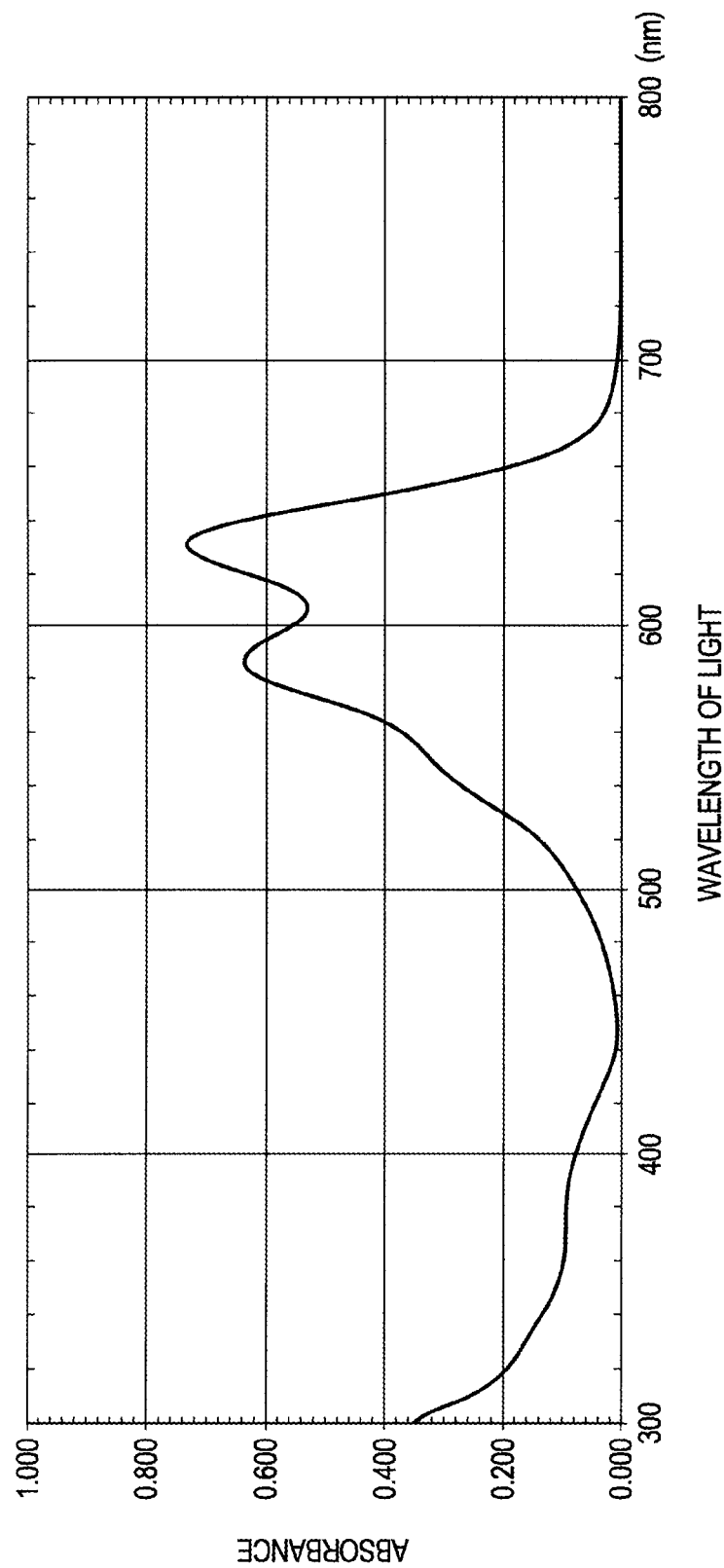
FIG. 5 is a graph showing an absorbance spectrum of a blue-colored dye (a first dye)
Figure 6:
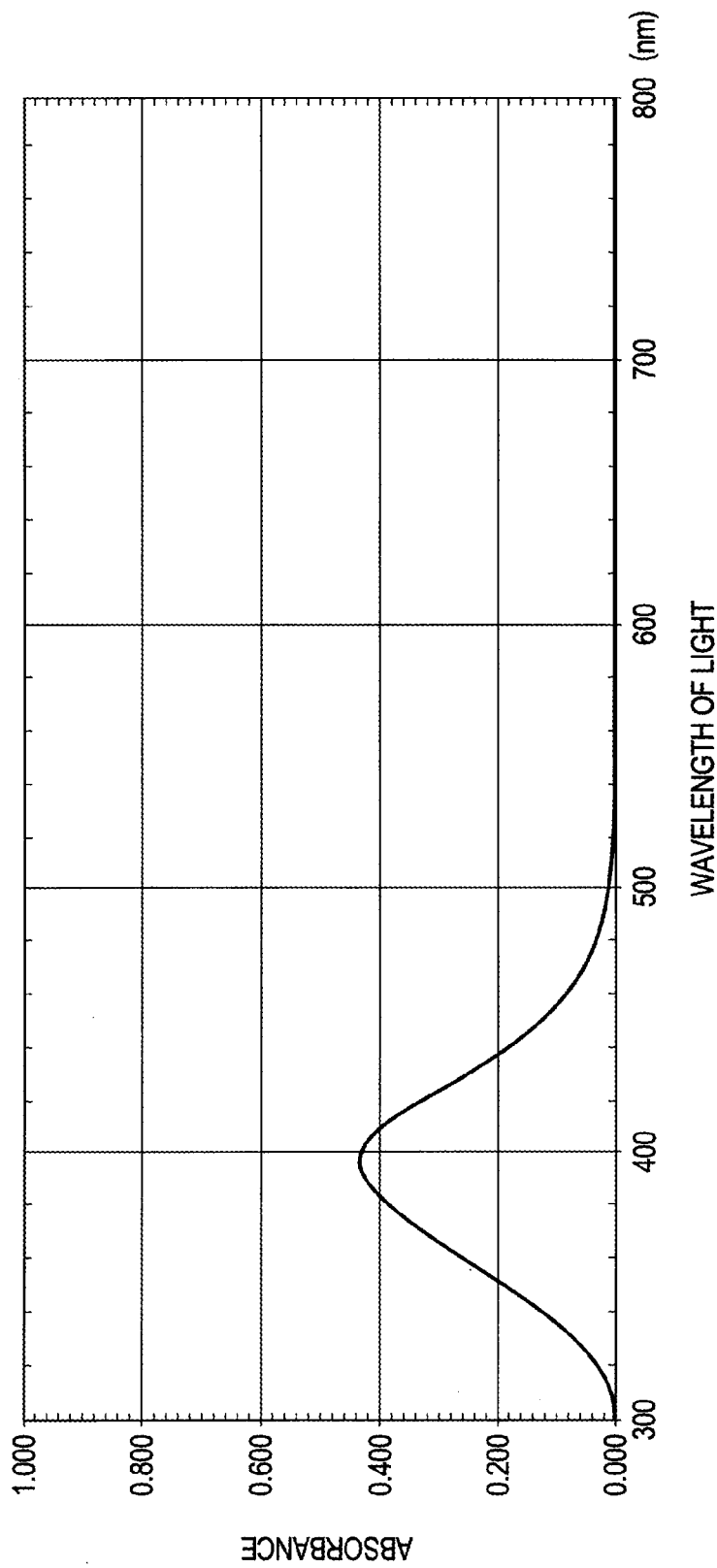
FIG. 6 is a graph showing an absorbance spectrum of a yellow-colored dye (a second dye)
Figure 7:
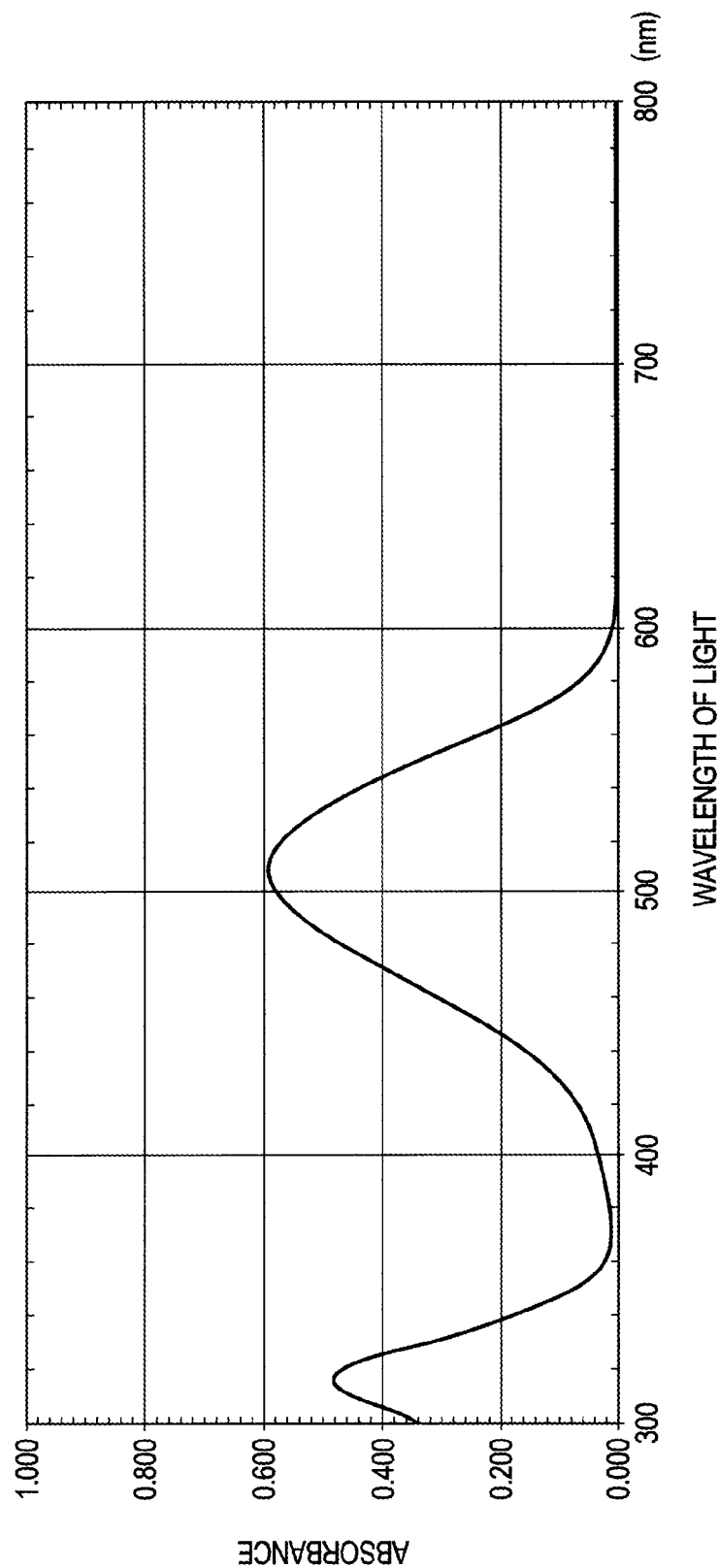
FIG. 7 is a graph showing an absorbance spectrum of a red-colored dye (a third dye)

One example of an absorbance spectrum of the first dye is shown in FIG. 5. One example of an absorbance spectrum of the second dye is shown in FIG. 6. One example of an absorbance spectrum of the third dye is shown in FIG. 7. From FIG. 5 to FIG. 7, horizontal axes represent a wavelength of light and vertical axes represent absorbance. As exemplified in FIG. 5, for example, an absorbed wavelength of the first dye is 530 nm or more and 660 nm or less. The first dye remarkably absorbs light having this wavelength. An absorbance peak wavelength of the first dye is for example, 632.0 nm. As exemplified in FIG. 6, for example, an absorbed wavelength of the second dye is 350 nm or more and 460 nm or less. The second dye remarkably absorbs light having this wavelength. An absorbance peak wavelength of the second dye is, for example, 394.5 nm. As exemplified in FIG. 7, for example, an absorbed wavelength of the third dye is 450 nm or more and 560 nm or less. The third dye remarkably absorbs light having this wavelength. An absorbance peak wavelength of the third dye is, for example, 508.0 nm.

A molecular formula of the first dye is, for example, $C_{34}H_{34}N_2O_2$, and a substance name thereof is 1,4-bis (2,6-diethylanilino) anthraquinone. A molecular formula of the second dye is, for example, $C_{16}H_{14}N_4O$, and a substance name thereof is solvent yellow-16. A substance name of the third dye is, for example, solvent red-143.

For example, Sumiplast Blue HL2R (trade name) manufactured by Sumika Chemtex Co., Ltd. can be used as the first dye. For example, Sumiplast Yellow GC (trade name) manufactured by Sumika Chemtex Co., Ltd. can be used as the second dye. For example, Sumiplast Red AS (trade name) manufactured by Sumika Chemtex Co., Ltd. can be used as the third dye.

An adequate amount of fine powder such as silica ($SiO_2$), which functions as a thixotropic agent and a hardness adjuster is preferably added so that the specific light transparent gel resin 18 in which this light absorbent is formulated retains each shape of the upper surface and the lower surface thereof being almost spherical, preferably, an ellipsoid of revolution in which an emitting surface of the light emitting element 14 and a receiving surface of the light receiving element 15 are a first focal point and a second focal point, and a degree of needle penetration of the cured material is 45 to 65 (based on JIS K 2220).

A light absorbent similar to the light absorbent contained in the specific light transparent gel resin 18 may also be contained in the light reflection resin 19.

When the light absorbent is added to the light reflection resin 19, an added amount thereof is 0.3% by weight or more is preferable. Color tone of the light reflection resin 19 can turn to black by adding 0.3% by weight or more of the light absorbent to the light reflection resin 19. For example, an added amount of the light absorbent to the light reflection resin 19 can be, for example, 0.5% by weight or more.

When the light absorbent is added to the light reflection resin 19, a concentration of the light absorbent may be higher than the concentration of the light absorbent in the specific light transparent gel resin 19. This is because uniform dispersion of the light absorbent is easy to maintain and the light absorbent is difficult to be recrystallized because a glass-transition temperature of the light reflection resin 19 is 150° C. or more and therefore molecular motion of the light reflection resin 19 is suppressed under a temperature environment of 150° C. or less which is a common operation temperature range of a semiconductor device.

Subsequently, a method for manufacturing the optical coupling element according to the embodiment is described.

This method for manufacturing includes the steps of: adding a dye absorbing light having shorter wavelength than a predetermined wavelength range including a light emitting wavelength of a light emitting element 14 in a concentration of 0.7% by weight or less to a light transparent resin (for example, a gel resin) containing a silicone resin; covering the light emitting element 14 and a light receiving element 15 which receives emitted light from the light emitting element 14 with a light transparent resin (for example, a specific light transparent gel resin 18); and covering a circumference of the light transparent resin with a light reflection resin 19. Hereinafter, this method is described in detail.

First, the light emitting element 14 and the light receiving element 15 is die-bonded to tabs 12c and 13c of each pair of the externally derived leads 12 and 13 over the lead frame 11 respectively with silver paste. Subsequently, each of electrode pads of the light emitting element 14 and the light receiving element 15 is bonding-coupled to the other externally derived leads 12b and 13b with bonding wires 16 and 17, respectively. Subsequently, the specific light transparent gel resin 18 is dropped from above to the light emitting element 14, the light receiving element 15 and a region covering an inner lead part of each of the externally derived leads 12 and 13. Thereafter, the specific light transparent gel resin 18 is cured under curing conditions of, for example, 150° C. for 2 hours. The above-described light absorbent is added to the specific light transparent gel resin 18.

Subsequently, a structure sealed by the specific light transparent gel resin 18 is set into a mold of the transfer molding device, which is not illustrated. Then, the light reflection resin 19 is filled into the mold and in-mold molding is performed to obtain a required packaging shape. As described above, the optical coupling element having the above-described structure is obtained.

Here, the optical coupling element may be manufactured though a process in which an optimum amount of the light absorbent is determined. More specifically, a method for manufacturing the optical coupling element may include the steps of: preparing a light transparent resin (for example, a gel resin) containing a silicone resin; determining an added amount of a dye so that the dye is not crystallized in the light transparent resin, when the dye absorbing light having shorter wavelength than a predetermined wavelength range including a light emitting wavelength of the light emitting element 14 is added to the light transparent resin; adding the dye within the range of the determined concentration to the light transparent resin; covering the light emitting element 14 and a light receiving element 15 which receives emitted light from the light emitting element 14 with the light transparent resin (for example, a specific light transparent gel resin 18); and covering a circumference of the light transparent resin with a light reflection resin 19.

In the optical coupling element obtained as described above, light emitted from the light emitting element 14 transmits through the specific light transparent gel resin 18 and reflects at an interface between the specific light transparent gel resin 18 and the light reflection resin 19, when the light from the light emitting element 14 is emitted by applying required electric power to the externally derived lead 12. The reflected light is received by the light receiving element 15 and outputted from the externally derived lead 13 as an electric signal. At this time, since outer shape of the specific light transparent gel resin 18 is an almost spherical shape or an ellipsoid of revolution, a large part of light which is emitted from the light emitting element 14 and reflected at the interface between the specific light transparent gel resin 18 and the light reflection resin 19 is directed to the light receiving element 15. Therefore, the optical coupling element can obtain high optical coupling efficiency.

According to the embodiment as described above, the shielding property for the incoming light is improved by adding the dye to the silicone resin without decreasing the transmission efficiency of the signal light in the silicone resin configuring the inner specific light transparent gel resin 18. More specifically, the visible light rejection dye formulated in the specific light transparent gel resin 18 as a light absorbent can absorb light in a range from ultra-violet ray to visible light, which is a major portion of an extremely small amount of external light passing through the light reflection resin 19, can decrease an amount of the external light reaching to the light receiving element 15, and can increase the S/N ratio of the light receiving element 15. Here, crystallization of the light absorbent can be suppressed because the visible light rejection dye formulated as the light absorbent in the specific light transparent gel resin 18 is formulated in a concentration which does not exceed the solubility in the specific light transparent gel resin 18. Consequently, the optical coupling element having excellent light transmission efficiency can be obtained because the light emitted from the light emitting element can transmit 14 to the light receiving element 15 without shielding caused by the specific light transparent gel resin 18.

Since color tone of the specific light transparent gel resin 18 in which the light absorbent is formulated turns to black, whether the light emitting element 14 and the light receiving element 15 are sufficiently covered with the specific light transparent gel resin 18 or not, and whether the specific light transparent gel resin 18 surly forms a light communication channel from the light emitting element 14 to the light receiving element 15 can be easily confirmed by using a general-purpose camera. Consequently, a potting amount of the specific light transparent gel resin 18 can easily be set to a minimum necessary amount (setting of higher margin of safety ratio is not required). As a result, it can be realized that an optical coupling element having a smaller outer shape is formed and the optical coupling element is manufactured in lower cost.

In addition, since the color tone of the specific light transparent gel resin 18 in which the light absorbent is formulated turns to black, there is no need to consider that the color tone of the light reflection resin 19 turns to black by a small amount of impurity (for example, iron or carbon black) which is mixed during a melting and kneading process in the manufacturing of the light reflection resin 19. Therefore, the light reflection resin 19 can be formed in lower cost.

Since the light reflection resin 19 contains fine powder of inorganic oxides having high relative permittivity such as titanium oxide ($TiO_2$), almost all external light coming from a fluorescent lamp or the sun is reflected at the outer surface of the light reflection resin 19 across the entire wavelength range. Consequently, deterioration of the S/N ratio of the light receiving element 15 is suppressed.

Particularly, when the light absorbent (the visible light rejection dye) is also contained in the light reflection resin 19 as similar to the specific light transparent gel resin 19, light in a range from ultra-violet ray to visible light which is a major portion of an extremely small amount of external light which will pass through the light reflection resin 19 can be absorbed by the light reflection resin 19. As a result, deterioration of the S/N ratio of the light receiving element 15 can be further suppressed. For example, when a resin thickness of the light reflection resin 19 is thin as 0.4 mm or less, the suppression effect can be sufficiently obtained. Infrared light emitted from the light emitting element 14 (the wavelength $\lambda=850\text{-}950$ nm) is not absorbed by the visible light rejection dye in the light reflection resin 19. Consequently, even when the light absorbent is contained in the light reflection resin 19, the infrared light emitted from the light emitting element 14 can be reflected in good efficiency at the interface between the specific light transparent gel resin 18 and the light reflection resin 19 by the fine powder of inorganic oxides having high relative permittivity such as titanium oxide ($TiO_2$). Color tone of the light reflection resin 19 turns to black by formulating the visible light rejection dye. Therefore, there is no need to consider that the color tone of the light reflection resin 19 turns to black by a small amount of impurity (for example, iron or carbon black) which is mixed during the melting and kneading process in the manufacturing of the light reflection resin 19. Therefore, the light reflection resin 19 can be formed in lower cost.

Subsequently, examples and comparative examples are described. FIG. 8 is a table showing properties of optical coupling elements of examples 1 and 2, and optical coupling elements of comparative examples 1, 2 and 3 (transmittance of signal light and transmittance of incoming light).

In each example, 55% by weight of the first dye, 25% by weight of the second dye and 20% by weight of the third dye were contained as the light absorbent. The following dyes were used. The first dye is Sumiplast Blue HL2R (trade name) manufactured by Sumika Chemtex Co., Ltd. The second dye is Sumiplast Yellow GC (trade name) manufactured by Sumika Chemtex Co., Ltd. The third dye is Sumiplast Red AS (trade name) manufactured by Sumika Chemtex Co., Ltd. A thickness of the thinnest part in the light reflection resin 19 (a thickness T1 in FIG. 2) was set to about 0.4 mm. A thickness of the specific light transparent gel resin 18 at the side of the light emitting element 14 and the light receiving element 15 to the externally derived leads 12 and 13 (a thickness T2 in FIG. 2) was set to about 0.55 mm. A thickness of the specific light transparent gel resin 18 at the opposite side of the light emitting element 14 and the light receiving element 15 to the externally derived leads 12 and 13 (a thickness T4 in FIG. 2) was set to about 0.05 mm. A thickness of the optical coupling element from the front surface to the back surface of the light reflection resin 19 (a thickness T3 in FIG. 2) was set to about 1.9 mm. A thickness of the light reflection resin 19 from a side part of the specific light transparent gel resin 18 to a side part of the light reflection resin 19 (a thickness T5 in FIG. 2) was set to about 0.5 mm.

In each comparative example, a package shape of the optical coupling element was the same as the examples.

In the example 1, the light absorbent was added only to the specific light transparent gel resin 18, and the added amount was varied.

In the example 2, the light absorbent was added to not only the specific light transparent gel resin 18 but also the light reflection resin 19, and each added amount was varied.

In the comparative example 1, a gel resin only different from the specific light transparent gel resin 18 in not adding the light absorbent was used instead of the specific light transparent gel resin 18. In addition, the light absorbent was not added to the light reflection resin 19.

In a first example of the comparative example 2 (upper row in FIG. 8), the gel resin only different from the specific light transparent gel resin 18 in not adding the light absorbent was used instead of the specific light transparent gel resin 18. In addition, not the light absorbent but carbon was added to the light reflection resin 19. In a second example of the comparative example 2 (lower row in FIG. 8), a gel resin only different from the specific light transparent gel resin 18 in adding carbon instead of the light absorbent was used instead of the specific light transparent gel resin 18. In addition, the light absorbent was not added to the light reflection resin 19.

In the comparative example 3, the gel resin only different from the specific light transparent gel resin 18 in not adding the light absorbent was used instead of the specific light transparent gel resin 18. In addition, the light absorbent which is the same light absorbent used in the example 1 was added to the light reflection resin 19 and the added amount was varied.

Transmission efficiency of the signal light shown in FIG. 8 is a relative value (%) of a measured value of an electric current value outputted from the light receiving element 15. Transmittance of incoming light shown in FIG. 8 is a relative value (%) of a measured value of cut off current of the light receiving element under a fluorescent lamp having a light intensity of 1000 lx. For properties of the optical coupling element, the higher the transmission efficiency of the signal light and the lower the transmittance of the incoming light, the higher and more excellent the S/N ratio of the light receiving element 15. The comparative example 1 is used as a standard for each of the examples 1 and 2 and the comparative examples 2 and 3. The measured values in the comparative example 1 are set to 100%.

First, the comparative example 2 is described. When 0.2% by weight of carbon is added to the light reflection resin 19 as a light absorbent, transmittance of the incoming light can be decreased to 1%. However, a transmission efficiency of the signal light becomes mere 23%, and therefore the transmission efficiency of the signal light is poor. This is because a large part of infrared light (a wavelength $\lambda=850$-$950$ nm) emitted from the light emitting element 14 is absorbed without reflection while incoming light is effectively absorbed because the carbon absorbs wide range of light from ultraviolet ray to infrared ray, and as a result, the light transmission efficiency to the light receiving element 15 is lowered. When 0.2% by weight of carbon is added to the gel resin as a light absorbent, a transmittance of the incoming light can be decreased to 5%. However, a transmission efficiency of the signal light becomes mere 1%, and therefore the transmission efficiency of the signal light is poor. This is because almost all light transmission is shielded due to addition of the carbon, which absorbs infrared light, in the gel resin which acts as a light communication channel, and as a result, the light transmission efficiency extremely deteriorated to 1%.

Subsequently, the example 1 is described. When a concentration of the light absorbent in the specific light transparent gel resin 18 was set to 0.3%, a value of 99% which was a high value as the transmission efficiency of signal light was obtained. A transmittance of the incoming light was 99% and this value was improved compared with the value in the comparative example 1. When a concentration of the light absorbent in the specific light transparent gel resin 18 was set to 0.5%, a value of 95% which was a high value as the transmission efficiency of signal light was obtained. A transmittance of the incoming light was 98% and this value was improved compared with the value in the comparative example 1. When a concentration of the light absorbent in the specific light transparent gel resin 18 was set to 1.0%, a transmission efficiency of signal light was 45%, and the value is better than the value in the comparative example 2. A transmittance of the incoming light was 50% and this value was improved compared with the value in the comparative example 1. In this case, the transmittance of the incoming light is significantly improved compared with the case in which a concentration of the light absorbent was set to 0.5% in the example 1.

Subsequently, the example 2 is described. When a concentration of the light absorbent in the specific light transparent gel resin 18 was set to 0.5% by weight and a concentration of the light absorbent in the light reflection resin 19 was set to 0.5% by weight, a value of 93% which was a high value as the transmission efficiency of signal light was obtained. A transmittance of the incoming light was 39% and this value was improved compared with the value in the comparative example 1. In this case, the transmittance of the incoming light is significantly improved compared with the case in which a concentration of the light absorbent was set to 0.5% in the example 1. When a concentration of the light absorbent in the specific light transparent gel resin 18 was set to 1.0% by weight and a concentration of the light absorbent in the light reflection resin 19 was set to 1.0% by weight, a transmission efficiency of signal light was 43%. This value was a better value than the value in the comparative example 2. A transmittance of the incoming light was 3% and this value was improved compared with the value in the comparative example 1. In this case, the transmittance of the incoming light is significantly improved compared with the case in which a concentration of the light absorbent was set to 1.0% in the example 1. When a concentration of the light absorbent in the specific light transparent gel resin 18 was set to 0.5% by weight and a concentration of the light absorbent in the light reflection resin 19 was set to 1.0% by weight, a value of 90% which was a high value as the transmission efficiency of signal light was obtained. A transmittance of the incoming light was 5% and this value was improved compared with the value in the comparative example 1. In this case, the transmittance of the incoming light is significantly improved compared with the case in which a concentration of the light absorbent was set to 0.5% in the example 1.

Subsequently, the comparative example 3 is described. When a concentration of the light absorbent in the light reflection resin 19 was set to 0.3% by weight, a transmission efficiency of signal light was 99% and a transmittance of the incoming light was 80%. When a concentration of the light absorbent in the light reflection resin 19 was set to 0.5% by weight, a transmission efficiency of signal light was 98% and a transmittance of the incoming light was 40%. When a concentration of the light absorbent in the light reflection resin 19 was set to 1.0% by weight, a transmission efficiency of signal light was 95% and a transmittance of the incoming light was 5%. However, in the comparative example 3, a gel resin is transparent because the light absorbent does not added to the gel resin. Consequently, whether the light emitting element 14 and the light receiving element 15 are surely covered with the gel resin or not cannot easily be confirmed by image processing.

When a transmittance of incoming light is, for example, 5% or less, an actual measurement value of an ampere meter is about 1 nanoampere. This value is close to a measuring limit value. Therefore, any values are within a range of measurement deviation. Consequently, in FIG. 8, each value in the middle row and the lower row in the example 2, the upper row and the lower row of the comparative example 2 and the lower row of the comparative example 3 has no substantial difference.

In the above-described embodiments, the examples and the comparative examples in which the light emitting element 14 and the light receiving element 15 are arranged over the tabs 12c and 13c directing in the same direction as shown in FIG. 1 and FIG. 2 are described. However, the light emitting element 14 and the light receiving element 15 may be arranged over the tabs facing each other and the light emitting element 14 and the light receiving element 15 may be arranged facing each other. In this case, similar effects to the above-described embodiments and the examples are obtained. In the above-described embodiments, the examples in which the gel resin is used as the light transparent resin is described. However, a rubber resin (a silicone rubber) may be used instead of the gel resin. In this case, similar effects to the above-described embodiments and the examples are also obtained.

What is claimed is:
1. An optical coupling element comprising:
   a light emitting element;
   a light receiving element which receives emitted light from the light emitting element;
   a light transparent resin which contains a silicone resin, covers the light emitting element and the light receiving element, and transmits signal light emitted from the light emitting element to the light receiving element; and
   a light reflection resin which covers a circumference of the light transparent resin,
   wherein a dye which absorbs light having a shorter wavelength than a predetermined wavelength range including a light emitting wavelength of the light emitting element is added in a concentration of 0.7% by weight or less to the light transparent resin.
2. The optical coupling element according to claim 1, wherein the dye is added in a concentration of 0.3% by weight or more.
3. The optical coupling element according to claim 1, wherein the dye absorbs light having a wavelength range of 740 nm or less.
4. The optical coupling element according to claim 1, wherein the dye comprises a blue-colored first dye, a yellow-colored second dye and a red-colored third dye.
5. The optical coupling element according to claim 4, wherein a concentration of the first dye is 0.2% by weight or less.
6. The optical coupling element according to claim 4, wherein a concentration of the second dye is 0.1% by weight or less.
7. The optical coupling element according to claim 4, wherein a concentration of the third dye is 0.08% by weight or less.
8. The optical coupling element according to claim 4, wherein a concentration of the first dye in the dye is 45% by weight or more and 65% by weight or less;
   wherein a concentration of the second dye in the dye is 20% by weight or more and 30% by weight or less;
   wherein a concentration of the third dye in the dye is 15% by weight or more and 25% by weight or less; and
   wherein a total concentration from the first dye to the third dye in the dye is 100% by weight or less.
9. The optical coupling element according to claim 4, wherein an absorbed wavelength of the first dye is 530 nm or more and 660 nm or less.
10. The optical coupling element according to claim 9, wherein a molecular formula of the first dye is $C_{34}H_{34}N_2O_2$.
11. The optical coupling element according to claim 4, wherein an absorbed wavelength of the second dye is 350 nm or more and 460 nm or less.
12. The optical coupling element according to claim 11, wherein a molecular formula of the second dye is $C_{16}H_{14}N_4O$.
13. The optical coupling element according to claim 4, wherein an absorbed wavelength of the third dye is 450 nm or more and 560 nm or less.
14. The optical coupling element according to claim 1, wherein the dye is added to the light reflection resin.
15. The optical coupling element according to claim 1, wherein the predetermined wavelength range is 850 nm or more and 950 nm or less.
16. A method for manufacturing an optical coupling element, the method comprising the steps of:
   adding a dye which absorbs light having shorter wavelength than a predetermined wavelength range including a light emitting wavelength of a light emitting element in a concentration of 0.7% by weight or less to a light transparent resin containing a silicone resin;
   covering the light emitting element and a light receiving element which receives emitted light from the light emitting element with a light transparent resin; and
   covering a circumference of the light transparent resin with a light reflection resin.
17. The method for manufacturing the optical coupling element according to claim 16, further comprising a step of:
   adding the dye to the light reflection resin.
18. A method for manufacturing an optical coupling element, the method comprising the steps of:
   preparing a light transparent resin containing a silicone resin;
   determining an added amount of a dye so that the dye is not crystallized in the light transparent resin, when the dye absorbing light having shorter wavelength than a predetermined wavelength range including a light emitting wavelength of the light emitting element is added to the light transparent resin;

adding the dye to the light transparent resin within the range of the determined concentration;

covering the light emitting element and a light receiving element which receives emitted light from the light emitting element with the light transparent resin; and covering a circumference of the light transparent resin with a light reflection resin.

19. The method for manufacturing the optical coupling element according to claim 18, further comprising a step of:

adding the dye to the light reflection resin.

* * * * *